United States Patent
Berkhout et al.

(10) Patent No.: US 9,680,429 B2
(45) Date of Patent: Jun. 13, 2017

(54) AMPLIFIER SYSTEM

(71) Applicant: NXP B.V., Eindhoven (NL)

(72) Inventors: Marco Berkhout, Tiel (NL); Armand Stuivenwold, Wijchen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/267,239

(22) Filed: Sep. 16, 2016

(65) Prior Publication Data

US 2017/0085233 A1    Mar. 23, 2017

(30) Foreign Application Priority Data

Sep. 17, 2015    (EP) .................................... 15185741

(51) Int. Cl.
*H04R 29/00*    (2006.01)
*H03F 3/387*    (2006.01)
(Continued)

(52) U.S. Cl.
CPC ............... *H03F 3/387* (2013.01); *H03F 1/26* (2013.01); *H03F 3/187* (2013.01); *H03F 3/2175* (2013.01); *H03F 3/45475* (2013.01); *H03F 3/45995* (2013.01); *H04R 3/007* (2013.01); *H04R 3/04* (2013.01); *H04R 29/003* (2013.01); *H03F 2200/03* (2013.01); *H03F 2200/18* (2013.01); *H03F 2200/294* (2013.01); *H03F 2200/462* (2013.01); *H03F 2200/471* (2013.01);
(Continued)

(58) Field of Classification Search
CPC .. H04R 5/04; H04R 1/1041; H04R 2201/028; H04R 2420/07; H04R 29/001; H04R 29/004; H04R 5/033; H04R 2420/05; H04R 3/14; H04R 1/00; H04R 1/1008; H04R 1/1083; H04R 2227/005; H04R 2420/01

USPC ...... 341/110, 139–142; 381/77, 123, 111, 57, 381/56, 71.4, 71.11, 71.6, 58, 120

See application file for complete search history.

(56) References Cited

U.S. PATENT DOCUMENTS 5,692,042 A * 11/1997 Sacca .................. H04M 9/08
                                                         379/390.01
8,150,058 B2 * 4/2012 Johnson ............. H04M 1/6008
                                                              330/69

(Continued)

FOREIGN PATENT DOCUMENTS

EP    1312303 A3    7/2003

OTHER PUBLICATIONS

Berkhout, Marco et al; "A 4Ω 2.65W Class-D Audio Amplifier With Embedded DC-DC Boost Converter, Current Sensing ADS and DSP for Adaptive Speaker Protection"; IEEE J. Solid-State Circuits, vol. 48, No. 12; 10 pages (Dec. 2013).

(Continued)

*Primary Examiner* — Linh Nguyen (57) ABSTRACT

An amplifier system is described. The amplifier system may amplify an audio signal transmitted via a connected loudspeaker in a first mode of operation. In a second mode of operation the amplifier system may amplify a signal generated by the loudspeaker operated in reverse as a microphone. Because a loudspeaker is less sensitive than a microphone the amplifier system may be used to acquire audio at high sound pressure levels for example at a concert or while making a phone-call in a noisy environment for example with a high level of wind noise.

15 Claims, 4 Drawing Sheets

(51) Int. Cl.
| | |
|---|---|
| H03F 3/187 | (2006.01) |
| H03F 3/217 | (2006.01) |
| H03F 3/45 | (2006.01) |
| H03F 1/26 | (2006.01) |
| H04R 3/04 | (2006.01) |
| H04R 3/00 | (2006.01) |

(52) U.S. Cl.
CPC .............. *H03F 2200/72* (2013.01); *H03F 2203/45528* (2013.01); *H04R 2400/01* (2013.01); *H04R 2420/01* (2013.01)

(56) References Cited

U.S. PATENT DOCUMENTS

| | | | | |
|---|---|---|---|---|
| 8,270,630 | B2* | 9/2012 | Johnson | H03G 3/301 |
| | | | | 330/69 |
| 2004/0240677 | A1* | 12/2004 | Onishi | G10K 11/1784 |
| | | | | 381/71.4 |
| 2005/0195991 | A1* | 9/2005 | Wang | H03F 1/305 |
| | | | | 381/94.5 |
| 2008/0036537 | A1 | 2/2008 | Syed | |
| 2013/0070930 | A1* | 3/2013 | Johnson | H04R 3/007 |
| | | | | 381/57 |
| 2013/0223652 | A1 | 8/2013 | Sahandiesfanjani et al. | |
| 2014/0072135 | A1* | 3/2014 | Bajic | G10K 11/1784 |
| | | | | 381/71.11 |
| 2014/0270312 | A1 | 9/2014 | Melanson et al. | |
| 2014/0369529 | A1* | 12/2014 | Quinn | H03F 1/0233 |
| | | | | 381/121 |

OTHER PUBLICATIONS

Extended European Search Report for Patent Appln. No. 15185741.4 (Feb. 23, 2016).

Jian, Xicheng et al; "A Low-Power, High-Fidelity Stereo Audio Codec in 0.13 μm CMOS"; IEEE J. of Solid-State Circuits, vol. 47, No. 5; 11 pages (May 2012).

Knowles; "SPH0641LM4H-1 Digital Zero-Height SiSonic (TM) Microphone With Multiple Performance Modes"; Product Data Sheet, Revision A; 14 pages (Apr. 17, 2014).

NXP; "TFA 9887—Audio system with adaptive sound maximize and speaker protection"; Rev. 1, Product short data sheet; 20 pages (Jul. 11, 2012).

* cited by examiner

AMPLIFIER SYSTEM

CROSS-REFERENCE TO RELATED APPLICATIONS

This application claims the priority under 35 U.S.C. §119 of European patent application no. 15185741.4, filed Sep. 17, 2015 the contents of which are incorporated by reference herein.

This disclosure relates to amplifier systems for loudspeakers.

The acquisition and reproduction of audio signals was among the first applications of electronic circuits. Nowadays, audio electronics are ubiquitous and can be found in television and hifi-stereo sets, car audio systems and more recently in cellular phones and many other portable applications. The vast majority of these electronics are in the form of integrated circuits. An example circuit is a smart speaker driver that maximizes acoustic output while ensuring that the speaker is not damaged. This is done by predicting the membrane excursion and estimating the voice-coil temperature by means of a speaker model. The membrane excursion is directly related to sound pressure level. Differences between the speaker model and the real world are eliminated by feeding back real-time measurement of the current going into the speaker.

The heart of the smart speaker driver is a high efficiency class-D amplifier that drives the actual loudspeaker. The amplifier is supplied by a DC-DC boost converter that guarantees high output power even at low battery voltage. The DC-DC boost converter is controlled from the digital domain and is only enabled when high power is needed at the amplifier output. The combined efficiency of the DC-DC boost converter and amplifier is optimized by doing a coarse envelope tracking of the audio signal.

An integrated load current sense including an analog to digital to converter (ADC) is used to measure the current through the speaker. The measured current information is fed back to an embedded digital signal processor (DSP) that runs a speaker protection algorithm and is also used to improve the quality of the sound output of the loudspeaker by boosting the lower audio frequencies.

Various aspects of the disclosure are defined in the accompanying claims. In a first aspect there is defined an amplifier system for a loudspeaker, the amplifier system comprising at least one terminal for connecting the amplifier to a loudspeaker; a first amplifier having an output coupled to the at least one terminal and an input for receiving an audio input signal; an analog to digital converter; a sensor having an input coupled to the at least one terminal and an output switchably coupled to the analog to digital converter and configured for sensing at least one of a current and a voltage; a second amplifier having an input coupled to the at least one terminal and an output switchably coupled to the analog to digital converter; a controller coupled to the first amplifier, the second amplifier, the sensor and the analog to digital converter, and wherein the controller is operable in a first mode of operation to enable the first amplifier, to couple the output of the sensor to the analog to digital converter and to disable the second amplifier; and in a second mode of operation to disable the first amplifier, disable the sensor, enable the second amplifier and to couple the output of the second amplifier to the analog to digital converter.

The amplifier system may be connected to a loudspeaker or speaker. In a first mode of operation, the amplifier system may amplify an audio signal for output via a connected loudspeaker. In a second mode of operation the amplifier system may amplify a signal generated by the loudspeaker operated in reverse as a microphone. A loudspeaker may be less sensitive than a microphone and may acquire audio at high sound pressure levels for example at a concert or making a phone-call in a noisy environment, for example in an outdoor environment with a high level of wind noise. The characteristics of the loudspeaker may be measured with the analog to digital converter. The measured characteristic may be used to equalize the acquired audio signal. When using the loudspeaker as microphone the analog to digital converter can be reused to capture the input signal generated on the loudspeaker terminals.

In one or more embodiments the second amplifier input is switchably coupled to the at least one terminal and wherein the controller is operable to disable the second amplifier by decoupling the input of the second amplifier from the at least one terminal in the first mode of operation.

In one or more embodiments, the second amplifier comprises a single amplifier stage.

By having a single amplifier stage rather than a dual amplifier stage which is typically used in microphone amplifiers, the power consumption in the second mode of operation may be significantly reduced allowing "always on" sensing applications in mobile phones whereby a speaker may be used as a microphone in a low power or standby mode of operation to detect an acoustic signal or a vibration.

In one or more embodiments the second amplifier comprises MOS transistors configured in a common gate mode of operation.

When the MOS transistors have a common gate which may be connected to a bias voltage, the input signal may be applied at the source of the input transistors instead of the gate. The input impedance is proportional to $1/g_m$ of the MOS transistors which can be in the kΩ range and can be considered negligibly high compared to the impedance of the loudspeaker which may be in the range of 4-8Ω. Furthermore, the common-mode level at the input of a common-gate topology is automatically fixed at about one threshold voltage $V_{THn}$ below the (arbitrary) bias voltage. This may result in a much lower noise amplifier than a traditional microphone amplifier.

In one or more embodiments the input of the second amplifier comprises a pair of differential inputs and wherein each of the pair of differential inputs is switchably coupled to the source of a respect pair of MOS transistors.

In one or more embodiments the amplifier system further comprises a pair of current sources, each of the pair of current sources being arranged between a source of a respective one of the pair of MOS transistors and a ground potential.

In one or more embodiments the second amplifier further comprises a bias circuit coupled to the gates of each of the pair of MOS transistors, wherein the bias circuit is configured to bias the MOS transistors in the weak inversion region.

In one or more embodiments the amplifier system further comprises a first chopper stabilization circuit arranged between the at least one terminal and the input of the second amplifier and a second chopper stabilization circuit arranged in series between the output of the second amplifier and the analog to digital converter, wherein the controller is coupled to the first and second chopper stabilization circuits and wherein in the second mode of operation the controller is configured to apply a predetermined chopper frequency to the first and second chopper stabilization circuits.

The 1/f noise contribution to the noise of the amplifier may be reduced by using chopper stabilization.

In one or more embodiments of the amplifier system the sensor comprises a sample and hold circuit.

In one or more embodiments of the amplifier system in the second mode of operation, the controller is configured to equalise an audio signal received from a loudspeaker connected to the at least one terminal based on a predetermined frequency response of the loudspeaker.

In one or more embodiments of the amplifier system in the first mode of operation, the controller is operable to sense a current flowing in a coil in a loudspeaker connected to the at least one terminal and to generate the predetermined frequency response from the detected current.

The amplifier system may characterise the loudspeaker in the first mode of operation from current measurements and use the characterized information to improve the processing of the loudspeaker when used as a microphone. The characterization and processing may be implemented by algorithms running on a digital signal processor.

In one or more embodiments the first amplifier comprises a class D audio amplifier.

Embodiments of the amplifier system may be included in a loudspeaker or speaker amplifier.

Embodiments of the amplifier system may be included in an integrated circuit.

Embodiments of the amplifier system may be included in a mobile device such as a mobile phone, laptop, personal digital assistant, a wearable device, portable medical equipment, an mp3 music player or other portable audio device.

BRIEF DESCRIPTION OF DRAWINGS

Embodiments of the invention are now described in detail, by way of example only, illustrated by the accompanying drawings in which.

Figure 1:
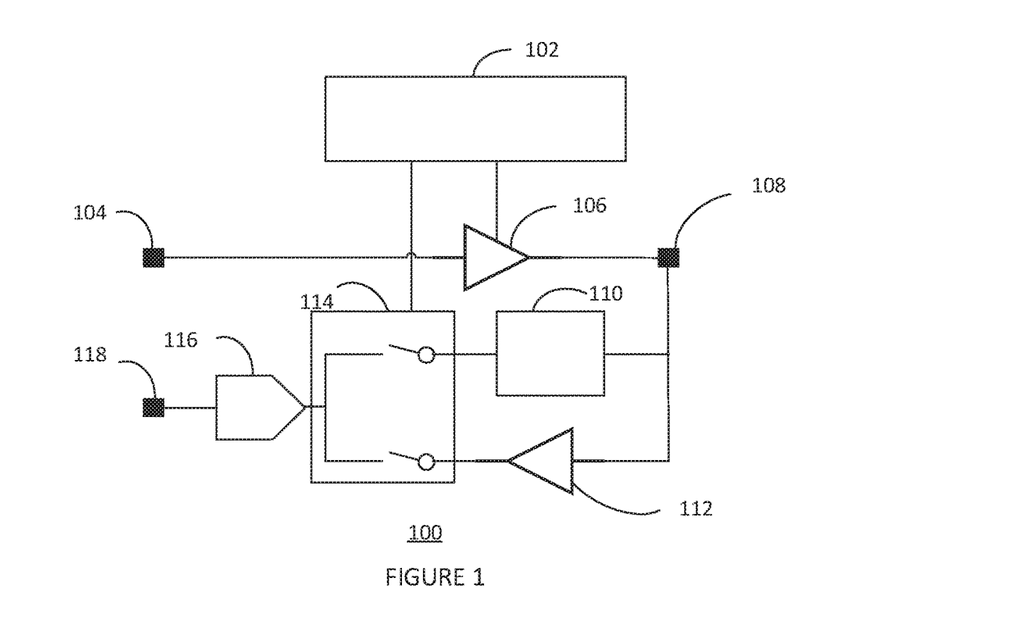
FIG. 1 shows an amplifier system according to an embodiment.

FIG. 1 shows an amplifier system 100. A controller 102 may be connected to an audio amplifier 106, which may be a speaker amplifier such as a class D amplifier. Audio amplifier 106 may have an input connected to an audio input terminal 104. The audio amplifier 106 may have an output connected to a speaker connection terminal 108. The output of the audio amplifier 106 may be a single ended or a differential output. The speaker connection terminal 108 may be connected to an input of a current sensor 110. An output of the current sensor 110 may be connected to an input of a routing module 114. The speaker connection terminal 108 may be connected to an input of a low noise amplifier 112. The term low noise amplifier is used to indicate that the primary function of the amplifier is to amplify the input signal while adding negligible noise, that is to say negligible with respect to the noise already present in the signal.

An output of the low noise amplifier 112 may be connected to the routing module 114. An output of the routing module 114 may be connected to an input of an analog to digital converter 116. An output of the analog to digital converter 116 may be connected to an output terminal 118. The controller 102 may be connected to the routing module 114. In operation, the speaker connection terminal 108 may be connected to a loudspeaker (not shown), the audio input terminal 104 may be connected to an audio source (not shown).

In a first mode of operation, the controller 102 may enable the audio amplifier 106, and select the output of the current sensor 110 be connected to the input of the analog to digital converter 116 via the routing module 114. It will be appreciated that the routing module 114 may be implemented for example using an analog multiplexer or other switching arrangement controlled by the controller 102. In this first mode of operation an audio signal generated by an audio source may be amplified by the speaker amplifier 106 and is then output by the loudspeaker. The current sensor 110 may detect the current flowing in the voice coil of a loudspeaker connected to the speaker terminal 108. The output of the current sensor 110 may then be digitised by the analog to digital converter 116 and then output on terminal 118. The measured current values may be used to control the amplitude of an audio signal to ensure, for example, that the speaker excursion limit is not exceeded.

In a second mode of operation, the controller 102 may disable the audio amplifier 106. The output of the audio amplifier 106 may be set in a high impedance mode or otherwise switchably disconnected from the speaker terminal 108. The controller 102 may disconnect the output of the current sensor 110 from the input of the analog to digital converter 116 and connect the output of the low noise amplifier 112 to the input of analog to digital converter 116 by controlling the routing module 114. In the second mode of operation, the amplifier system 100 may be configured to support a speaker-as-microphone mode of operation, whereby a signal may be induced on the terminal or terminals of the loudspeaker. The induced signal may be amplified by the low noise amplifier 112 to increase the dynamic range prior to converting to a digital format by the analog to digital converter 116. This allows a relatively low cost analog to digital converter to be used both by the current sensor in the first mode of operation and to digitize signals from the speaker in the second mode of operation when the speaker is configured as a microphone.

Figure 2:
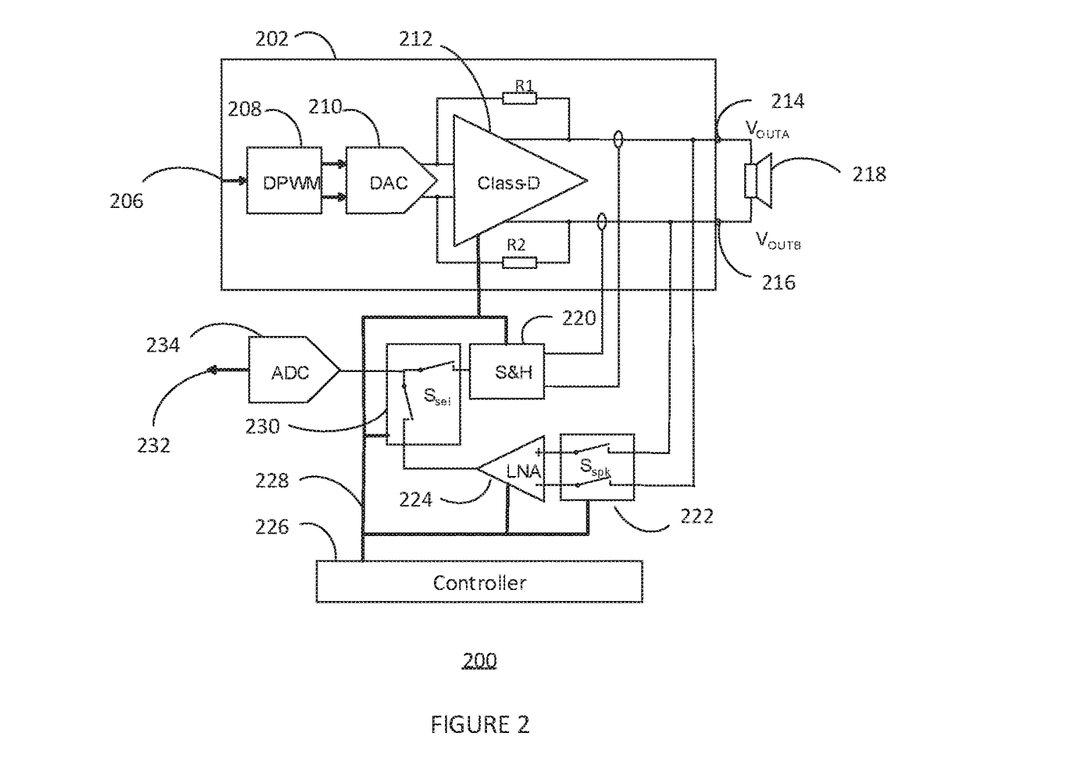
FIG. 2 illustrates an amplifier system according to an embodiment.

FIG. 2 shows an amplifier system 200. An audio amplifier 202 may have an input 206 and an output connected to speaker terminals 214 and 216. The audio amplifier 202 may include a series arrangement of a digital pulse width modulator 208, a digital to analog converter 210, and an amplifier 212. The digital pulse width modulator 208 may have an input connected to the audio input terminal 206. The digital pulse width modulator 208 is followed by a digital to analog converter 210. The output of the digital to analog converter 210 may be connected to an input of a class D audio amplifier 212. The class D audio amplifier 212 may have a differential input and a differential output. The class-D amplifier 212 may have resistors R1 and R2 connected between a respective differential outputs and differential inputs. The current sensor 220 which may include for example a sample and hold circuit, may be connected to the loudspeaker connection terminals 214 and 216. Speaker switch 222 may be connected to the loudspeaker terminals 214 and 216. An output of the speaker switch 222 may be connected to low noise amplifier 224. An output of low noise amplifier 224 may be connected to selection switch 230. An output of the current sensor 220 may be connected to selection switch 230. An output of selection switch 230 may be connected to an input of analog to digital converter 234. An output of analog to digital converter 234 may be connected to an output terminal 232 and a controller 226 may be connected to a control input of the class-D amplifier 212, sample and hold current sensor circuit 220, selection switch 230, low noise amplifier 204 and the speaker switch 222 via one or more control lines 228. A speaker 218 may be connected to the speaker connection terminals 214 and 216.

In a first mode of operation, the controller 226 may enable the class D amplifier 212, and select the output of the current sensor 220 to be connected to the input of the analog to digital converter 234 via the selection switch 224. The input of the low noise amplifier 224 may be disconnected from the speaker 218 by open circuiting speaker switch 222. In this first mode of operation, an audio signal generated by an audio source (not shown) may be amplified by the speaker amplifier 202 and then output by the loudspeaker 218. The current sensor 220 may detect the current flowing in the voice coil of the loudspeaker 218. The output of the current sensor 220 may then be digitised by the analog to digital converter 232 and then output on terminal 232. The digitized output signal may be used for signal processing to, for example, alter the audio signal characteristics to ensure that a speaker excursion limit of loudspeaker 218 is not exceeded. The skilled person will appreciate that this signal processing may, for example be implemented by algorithms running on a digital signal processor or DSP (not shown).

In a second mode of operation, the controller 226 may disable the class D amplifier 212. The output of the class D amplifier 212 may be set in a high impedance mode or otherwise switchably disconnected from the speaker connection terminals 214 and 216. The controller 226 may disconnect the output of the current sensor 220 from the input of the analog to digital converter 234 and connect the output of the low noise amplifier 224 to the input of analog to digital converter 234 by controlling the selection switch 230. The controller 226 may connect the inputs of the low noise amplifier 224 which may be differential inputs to the respective loudspeaker connection terminals 214 and 216 by closing the switches in speaker switch module 222. In the second mode of operation, the amplifier 200 may be configured to support a speaker-as-microphone mode of operation, whereby a signal may be induced on the terminal or terminals of the loudspeaker. The induced signal may be amplified by the low noise amplifier 224 to increase the dynamic range prior to converting to a digital format by the analog to digital converter 234. This allows a relatively low cost analog to digital converter to be used both by the current sensor in the first mode of operation and in the speaker as microphone mode or second mode of operation. The frequency response of the speaker 218 may be captured by the measurement of the current using a current sensor in a first mode of operation, for example the current sensor 220 in the amplifying system 200. The frequency response may be processed and used to adapt, for example by equalization, the audio input signal present on an input 206 during the second mode of operation.

Figure 3:
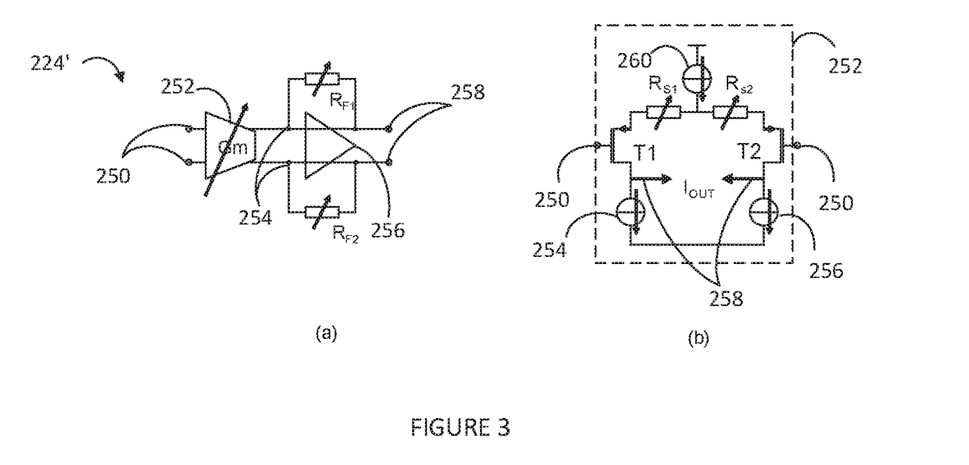
FIG. 3 shows a) a typical microphone amplifier circuit and b) an example variable transconductance circuit used in the typical microphone amplifier circuit.

In the second mode of operation which may be when the speaker 218 is operated as a microphone, the low noise amplifier 224 may be implemented as a typical microphone amplifier. An example implementation of such an amplifier is shown in FIG. 3. FIG. 3A shows the overall architecture of a typical microphone amplifier 224' which may be used for example in the amplifier system 200. The differential input terminals 250 may be connected to a transconductance input stage 252. The differential output of the transconductance input stage 252 may be connected to a further amplifier stage 256. Each of the differential outputs of the further amplifier stage 256 may be connected to each of the respective differential inputs 254 of the further amplifier stage 256 via the feedback resistors Rf1 and Rf2. The transconductance stage 252 may be implemented by the circuit shown in FIG. 3B which is arranged as a resistively degenerated differential pair. A differential pair of transistors T1 and T2 which in this example are PMOS transistors may have a source connected to a current source 260 via variable resistors Rs1 and Rs2. The gates of each of the transistors T1 and T2 are connected to a respective one of the pair of differential inputs 250, and the drains of transistors T1 and T2 are each connected to a respective one of the differential outputs 258. Each of the outputs of the differential output pair 258 may be connected to a ground potential via respective current sources 254 and 256 which may set the operating point of the differential output pair 258. The microphone amplifier of FIG. 3 is typically used with MEMS microphone modules. Such modules contain a microphone and an amplifier IC that produces an analog voltage or digital pulse density modulation (PDM) stream directly. MEMS microphones and other microphones such as electret microphones have a capacitive source impedance. Consequently the amplifier transconductance input stage 252 has a very high input impedance which is realised by connecting the differential input pair 250 to the gates of transistors T1 and T2. The gain of the amplifier may be programmable by altering the value of transconductance Gm by for example varying resistors Rs1 and Rs2, and by altering the values of Rf1 and Rf2 so that microphones with different sensitivities can be connected. The low noise amplifier circuit 224' may require an additional common mode correction circuit because of the high input impedance.

Figure 4:
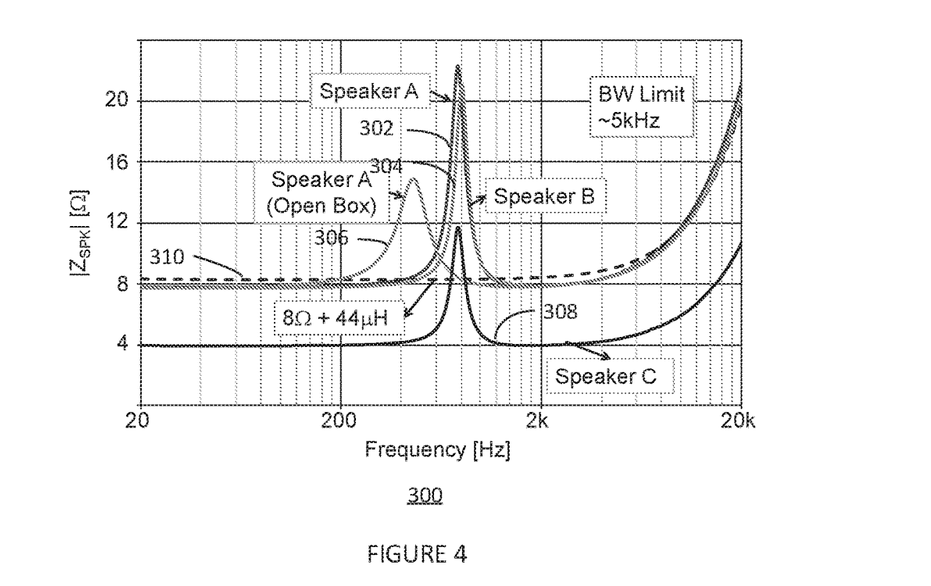
FIG. 4 shows a graph of example speaker frequency responses

FIG. 4 shows a graph 300 of the frequency response of different loudspeakers which may be captured by current measurement of the amplifying system 200 during the first mode of operation. The x-axis shows the frequency in hertz ranging between a value of 20 Hz and 20 kHz on a logarithmic scale. The y-axis indicates the speaker impedance at a particular frequency value ranging between 4 ohms and 24 ohms on a linear scale. A first speaker response curve 302, and second speaker response curve 304 are illustrated for speakers having a nominal 8 ohm impedance. The response curves 302 and 304 shows a resonant peak of 22 ohms at around 800 Hz due to the mechanical resonance of the loudspeaker. Otherwise the response is predominantly flat at a value of 8 ohms between 20 Hz and 2 KHz. The impedance value of response curve 302 and 304 increases after frequency of 2 kHz to a value of approximately 22 ohms at a frequency of 20 kHz. This may be due to the inductance component of the speaker coil impedance becoming dominant at the higher frequencies. As can be seen by comparison with the dashed line 310, neglecting the mechanical resonance component, for these example speakers the frequency response corresponds approximately to that expected by a complex impedance having a resistive component of 8 ohms and an inductance of 44 µH. Response curve 306 shows the same speaker used for response curve 302 but in "open box". The response curve 306 shows a shift in the mechanical resonance peak to a lower frequency of around 500 Hz compared to the response curve 302 of the same speaker in the "closed box".

Figure 5:
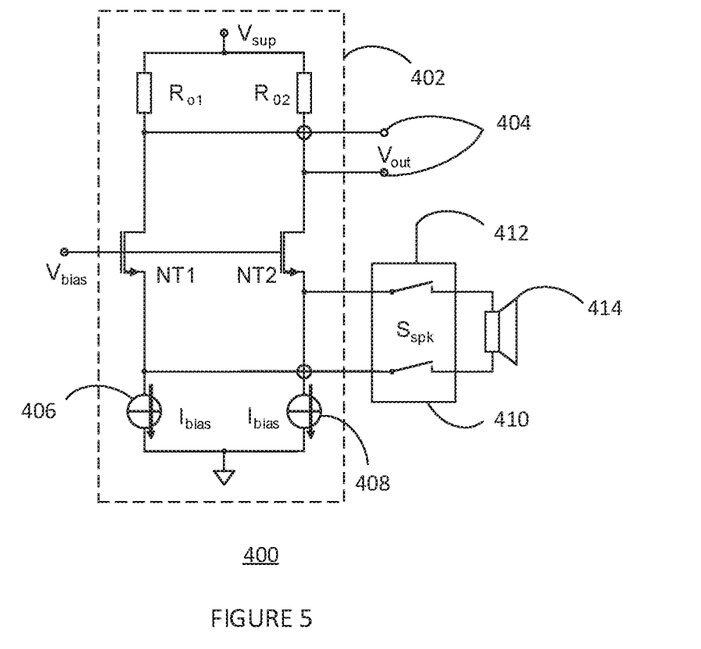
FIG. 5 illustrates an amplifier according to an embodiment.

FIG. 5 shows an amplifier system 400 which includes a low noise amplifier circuit 402 for use with a speaker when configured as microphone. Low noise amplifier circuit 402 may have a first n-type FET NT1 and a second n-type FET NT2. The gates of NT1 and NT2 may be connected together. The source of NT1 may be connected to a current source 406 to provide a bias current. The source of NT2 may be connected to a current source 408 to provide a bias current $I_{bias}$. The current source 406 and the current source 408 may provide a current path between the sources of the respective transistors and T1 and T2 to a ground potential. The source of NT1 may be connected to a first switch in speaker switch module 410. The source of NT2 may be connected to a second switch in the speaker switch module 410. The first and second switches may be controlled by a controller (not shown) connected to the control terminal 412 of the speaker switch module 410. The first and second switches may be implemented as high-voltage transistors for example high-voltage nFETs whereby each of the NFETS can be switched of by pulling the gate to a ground potential. In this context "high voltage" means higher than standard CMOS voltage levels which may be for example 1.8V. High voltages may be voltages for example in the range of 5V-12V. These NFETs may be the same transistors that are used in class D amplifiers described in various examples herein. The drains of NT1 and NT2 are connected to a respective terminal of a pair of differential output terminals 404. The drains of the input transistors NT1 and NT2 may be operably connected to a supply voltage via a respective one of a pair of output resistors Ro1 and Ro2.

In operation, when the speaker is to be used as a microphone input, each of the two terminals of a loudspeaker 414 may be switchably coupled to a respective one of the source of transistor NT1 and the source of transistor NT2 by closing the switches in the speaker switch module 410. In contrast to the circuit of FIG. 3, the input signal is applied at the source of the transistors rather than the gate. The gates of NT1 and NT2 are biased at an arbitrary bias voltage Vbias. The bias voltage may be 100-200 millivolts above the threshold voltage of transistors NT1 and NT2 corresponding to a bias voltage value of 700 mV. The loudspeaker sees an input impedance proportional to 1/gm of the input transistors NT1 and NT2 which can easily be in the kΩ range and can be considered negligibly high, since as shown in FIG. 3, a loudspeaker impedance is typically between 4 to 8Ω. Furthermore, the common-mode level at the input of a common-gate topology is automatically fixed at about one threshold voltage VTHn below the (arbitrary) bias voltage Vbias so unlike the microphone amplifier 224' described in FIG. 3, no additional common mode correction circuit is required at the input. In this configuration the input transistors NT1 and NT2 may be essentially the only contributors to the equivalent differential input noise. The noise of the current sources 406 and 408 is almost entirely common mode noise, since they are effectively shorted by the loudspeaker. The noise of the output resistors $R_{O1}$, $R_{O2}$ is insignificant because calculated back to the input it is divided by the amplifier gain. The noise of the switches in the speaker switch module 410 may be negligible as long as their on-resistance is much lower than the 1/gm input impedance. The gain of the amplifier is the product of the gm of the input transistors NT1 and NT2 and the output resistors $R_{O1}$, $R_{O2}$. The output common mode level is dependent on the bias current $I_{bias}$ and output resistors $R_{O1}$, $R_{O2}$.

The amplifier circuit 402 has only one stage in comparison with the amplifier circuit 224' which has two stages and so consequently requires much lower power to operate. When incorporated into for example a mobile device such as a mobile phone, this may allow an "always on" mode of operation whereby the amplifier circuit together with a speaker may be used to monitor the environment and for example to wake up the system if an activation signal is generated by the loudspeaker when used as a microphone. The amplifier circuit 402 may have a gain for example in the region of 50 dB or less.

Figure 6:
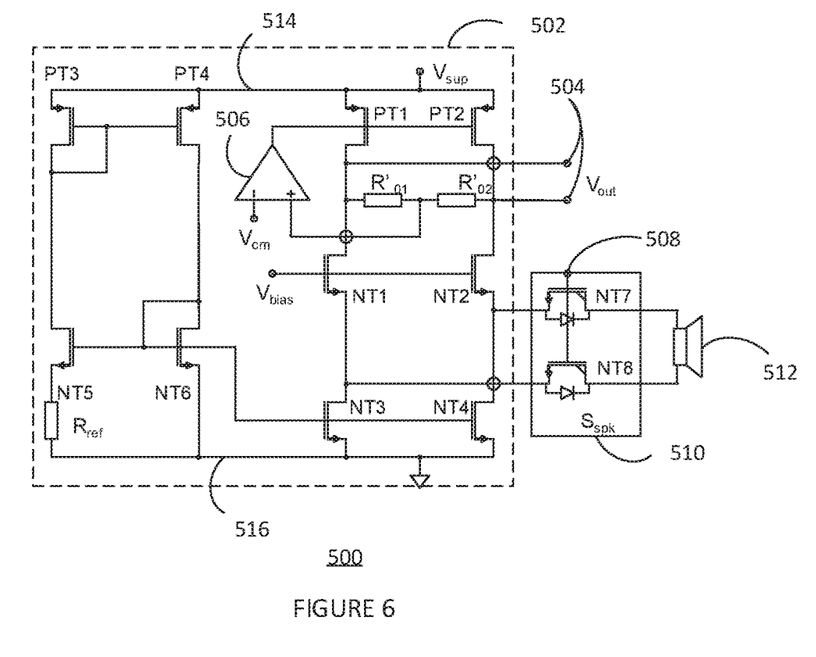
FIG. 6 shows an amplifier according to an embodiment.

FIG. 6 illustrates an amplifier system 500 which includes a low noise amplifier circuit 502 for use with a speaker when configured as a microphone which regulates the output common mode level. The low noise amplifier circuit 502 may include a biasing arrangement of FET transistors NT5, NT6, PT3 and PT4. PFET transistors PT3 and PT4 may have sources coupled to a supply rail 514, and gates coupled together. The gate of transistor PT3 is connected to the drain of transistor PT3. NFET transistors and NT5 and NT6 may have gates connected together. The gate of NT6 may be connected to the drain of NT6. The drain of PT3 may be connected to the drain of NT5. The drain of PT4 may be connected to the drain of NT6. The source of NT5 may be connected to ground 516 via a reference resistor Rref.

The source of NT6 may be connected to ground 516. The gates of transistors NT5 and NT6 may be connected to the gates of NFET transistors NT3 and NT4. The source of transistors NT3 and NT4 may be connected to a ground rail 516. The drain of transistor NT3 may be connected to the source of transistor NT1. The drain of the transistor NT1 may be connected to the drain of a PFET transistor PT1. The source of PFET transistor PT1 may be connected to a supply rail 514. The drain of transistor NT4 may be connected to the source of transistor NT2. The drain of the transistor NT2 may be connected to the drain of a PFET transistor PT2. The source of PFET transistor PT2 may be connected to a supply rail 514. The drain of PFET PT1 may be connected to a first terminal of differential output 504, the drain of PFET PT2 may be connected to a second terminal of differential output 504 via a series arrangement of first output resistance $R_{o1}'$ and second output resistance $R_{o2}'$. The common node between $R_{o1}'$ and $R_{o2}'$ may be connected to a non-inverting input of op-amp 506. The output of op-amp 506 may be connected to the gate of PFETs PT1 and PT2. A speaker switch module 510 may have a NFET NT7 with one of a source or drain connected to a first terminal of speaker 512 and the other of a source or drain connected to the source of input NFET transistor NT2. The speaker switch module 510 may have a NFET NT8 with one of a source or drain connected to a second terminal of speaker 512 and the other of a source or drain connected to the source of the input NFET transistor NT1. The gates of transistors NT7 and NT8 may be connected to control terminal 508. The transistors NT8 and NT9 can be implemented with two simple high-voltage transistors (same type and breakdown voltage as used in the class-D amplifier). The speaker may disconnected by pulling the gates of the switch transistors NT8 and NT9 to ground.

For low noise the input transistors may be biased in the weak inversion region. In weak inversion the $g_m$ of the transistors is given by:

$$g_m = I_D \frac{q}{n \cdot kT} \quad (1)$$

where $I_D$ is the drain current, q/kT is the thermal voltage and n the so-called slope factor which typically has a value of approximately 1.4. From equation (1) can be seen that the $g_m$ and therefore the gain of the amplifier is inversely proportional to absolute temperature T. The low noise amplifier circuit 502 includes a bias circuit formed by transistors PT3, PT4, NT5 and NT6, NT3 and NT4 having a bias current $I_{bias}$ proportional to absolute temperature (PTAT) that is to say a "constant gm biasing" circuit. The bias circuit may produce a PTAT current through NT3 and NT4 that is also proportional to $R_{ref}$. The overall gain of the amplifier circuit 502 may be proportional to the ratio of the output resistors $R_{o1}'$, $R_{o2}'$, and reference resistor, i.e. assuming $R_{o1}'$ and $R_{o2}'$ have a resistance $R_o$, the ratio will be $R_o/R_{ref}$ and so, as will be appreciated, the gain may be made programmable.

Amplifier circuit 502 may have a common-mode feedback loop via op-amp 506 that regulates the common-mode output level to the desired common-mode input level $V_{cm}$ of a connected analog to digital converter (not shown) which is typically at a value of half the supply voltage if $R_{o1}'$ and $R_{o2}'$ have an equal value.

The input transistors NT1 and NT2 may be considered as the dominant noise sources. The amplifier circuit 502 may have a close to ideal thermal noise performance, that is to say the thermal noise contribution is only due to the thermal noise from the input transistors NT1 and NT2 and the contribution to thermal noise from the other circuitry may be considered as negligible. The 1/f noise contribution can be reduced by increasing the gate area of the input transistors. The amplifier circuit 502 may be included for example in low noise amplifier 112 or low noise amplifier 224 described in the example amplifier systems 100 and 200.

Figure 7:
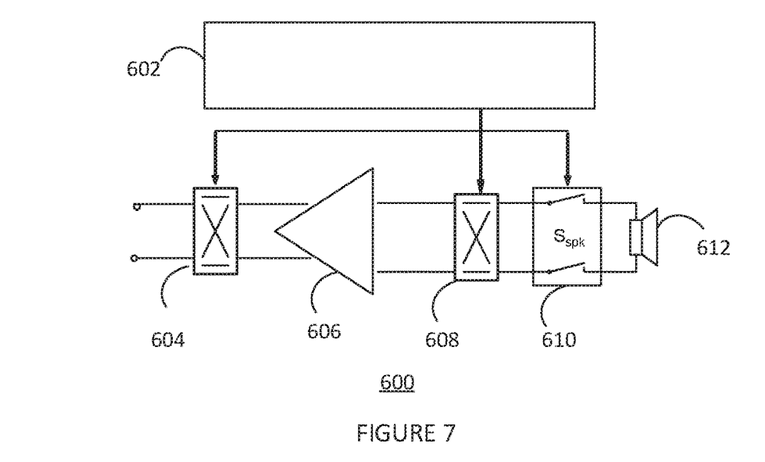
FIG. 7 illustrates an amplifier system according to an embodiment.

FIG. 7 shows an amplifier system 600. The controller 602 may be connected to a first or input chopper stabilisation circuit 608 and second or output chopper stabilisation circuit 604. Controller 602 may be connected to speaker switch module 610. A speaker 612 may be switchably connected to a first chopper stabilization circuit 608 via the speaker switch module 610. An output of the first chopper stabilization circuit 608 may be connected to an input of low noise amplifier 606. The low noise amplifier 606 may include for example the amplifier circuit 502 described in the example amplifier system 500, or the amplifier circuit 402 described in the example amplifier system 400. The low noise amplifier 606 may have a differential input and a differential output. The output of low noise amplifier 606 may be connected to an input of the second chopper stabilization circuit 604. In a first mode of operation the controller 602 may disconnect the speaker 612 from the first chopper stabilization circuit 608 and connect an audio speaker amplifier (not shown) to the speaker. In a second mode of operation, the controller 602 may disconnect the audio speaker amplifier and connect the input of chopper stabilization circuit 608 to the speaker 612. The controller 602 may apply a switching frequency f to both input chopper stabilization circuit 608 and output chopper stabilization circuit 604. The 1/f noise contribution may be reduced by the input and output chopper stabilization circuits. The implementation of chopping is relatively simple since there are no high-impedance nodes in the circuit. For example the skilled person will appreciate that the chopper stabilization circuit 608, 604 may typically be implemented with 4 switches or transistors. The input chopper 608 may be typically implemented with 4 CMOS (low-voltage) switches which may selectively connect either of the terminals of the receiver speaker to either of the differential inputs of the low noise amplifier 606. The input chopper stabilization circuit 608 may be in series with a speaker switch module 610 including two high-voltage switches. Alternatively, the functionality of the input chopper stabilization circuit 608 and the speaker switch module 610 may be implemented with 4 high-voltage switches. The chopper stabilization circuit 608 may periodically invert the input to the low noise amplifier 606 by swapping the input signals from the speaker terminals to the differential input of the low noise amplifier 606. The output of the low noise amplifier 606 may be inverted synchronously with the input by the chopper stabilization circuit 604 such that the overall signal transfer remains unaltered. This may modulate the DC offset and low frequency 1/f noise out of the signal bandwidth.

Figure 8:
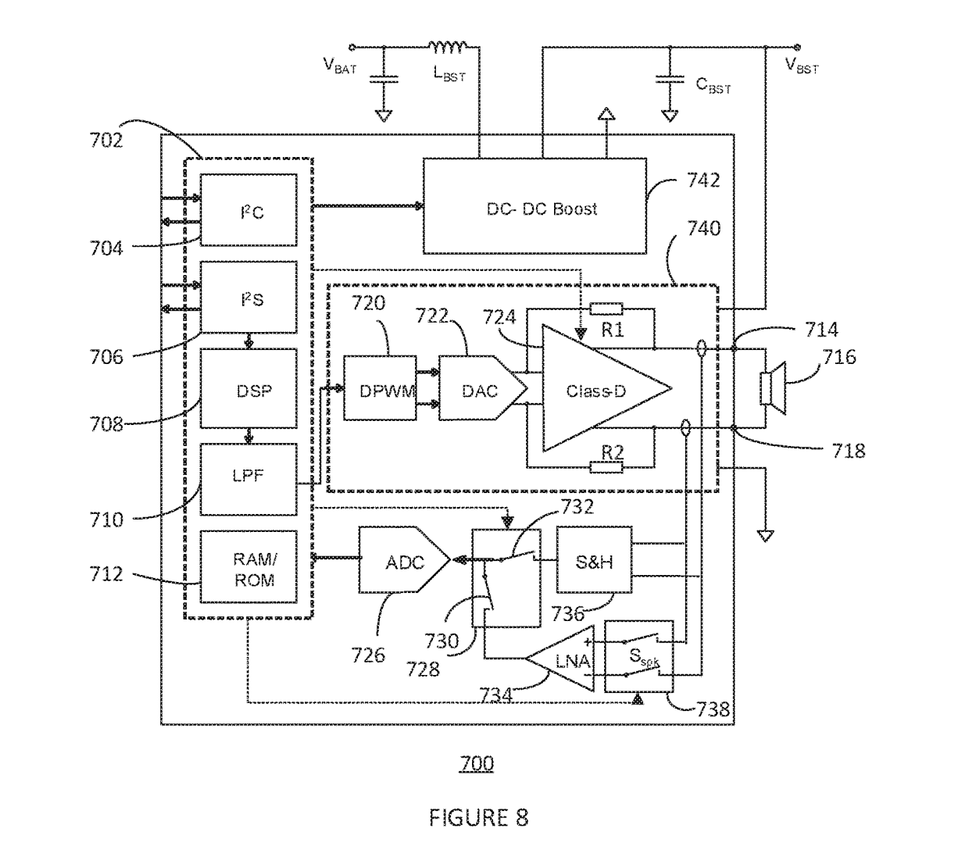
FIG. 8 shows an amplifier system according to an embodiment.

FIG. 8 illustrates an amplifier system 700 which may be implemented as an integrated circuit. The controller 702 may include an I²C interface 704, and I²S interface 706, a digital signal processor (DSP) 708, a low pass filter 710, and a memory 712 which may include RAM and/or ROM. The skilled person will appreciate that the elements described in the controller 702 may be connected together via a control and/or data bus. An output of the controller 702 may be connected to a DC-DC boost circuit 742. The DC-DC boost circuit 742 may supply a boosted voltage to audio amplifier 740. The audio amplifier 740 may have an input connected to an output of the lowpass filter 710. The output of the lowpass filter 710 may be connected to the digital pulse width (DPWM) modulation module 720. The output of digital pulse width modulation 720 may be connected to a digital to analog converter 722. The output of digital to analog converter 722 may be connected to a class D amplifier 724. The output of class-D amplifier 724 may be connected to first and second speaker connection terminals 714 and 718. Resistors R1 and R2 may be connected between each of the differential outputs of the class D audio amplifier and the respective differential inputs of the class D audio amplifier. The speaker terminals 714, 718 may be connected to a speaker switch module 738. The speaker switch module 738 may have an output connected to an input of a low noise amplifier 734. Low noise amplifier 734 may be implemented using one of the amplifier circuits herein described for example including but not limited to amplifier circuit 402, amplifier circuit 502, or amplifier 224'. An output of low noise amplifier 734 may be connected to a first switch 730 in switch selection module 728. A first speaker connection terminal 714 may be connected to a sample and hold circuit 736. A second speaker connection terminal 718 may be connected to the sample and hold circuit 736. An output of the sample and hold circuit 736 may be connected to a second switch 732 in switch selection module 728. An output of switch selection module 728 may be connected to an input of analog to digital converter 726. An output of analog to digital converter 726 may be connected to the controller 702. The dashed arrowed lines from the controller to the class-D amplifier 724, the switch selection module 728, and the speaker switch module 738 represent various control line lines and/or path between the controller 702 and the respective blocks.

In a first mode of operation, which may be considered a normal mode whereby the speaker is being driven by the class-D amplifier 724, the controller 702 may enable the class-D amplifier 724. The controller may connect the sample and hold circuit 736 to the input of the analog to digital converter 726 by closing switch 732. The controller 702 may disconnect the output of local noise amplifier 734 by opening switch 730. The controller 702 to may also disconnect the input of the low noise amplifier 734 from the speaker terminals 714, 718 by opening the switches in the speaker switch module 738. In the first mode of operation, an audio signal from the controller 702 may be amplified by the class-D amplifier 724 and transmitted to a loudspeaker 716 that is connected to the loudspeaker terminals 714 and 718. The sample and hold circuit 736 may sample values representative of a current flowing through a coil of the loudspeaker 716 and/or a voltage across the terminals 714, 718 of the loudspeaker. The controller 702 may monitor the sensed values after they are converted to digital format by the analog to digital converter 726. The controller 702 may use the sensed values to control the audio signal such that the membrane excursion limit of a loudspeaker 716 is not exceeded. The controller 702 may optionally or in addition characterise the frequency response of the loudspeaker by monitoring the current through the loudspeaker coil for different audio frequencies. The results of this characterisation may be stored in the memory 712.

In a second mode of operation, which may be considered a speaker as microphone mode, the controller 702 may disable the class-D amplifier 724 by, for example, making the output high impedance. The speaker terminal 714 and speaker terminal 718 may be connected to the input of the low noise amplifier 734 by closing the switches of speaker switch module 738. The output of the low noise amplifier 734 may be connected to the input of the analog to digital converter 726 by closing the switch 730. The sample and hold circuit 736 which may act as a current and/or voltage sensor may be disconnected from the input of the analog to digital converter 726 by opening the switch 732. In this second mode of operation, an audio input signal detected on the speaker terminals 714 and 718 may be amplified by the low noise amplifier 734 and converted to a digital format by analog to digital converter 726. The audio signal may then be processed by the controller 702. The controller 702 may equalise signal from the loudspeaker based on the characterisation of the speaker carried out in the first mode of operation using the parameters stored in the memory 712. The skilled person will appreciate how this equalisation may be performed.

In a further example a microphone (not shown) may be connected to the controller 702 and the controller 702 may switch between the second mode or speaker as microphone mode and the first or normal mode dependent on whether the microphone is used as an input source is from a microphone or a loudspeaker. A typical microphone such as a MEMS microphone module when used in mobile phones has an acoustic overload point of 10% total harmonic distortion (THD) around 120 dB. At higher sound pressure levels occurring for example during a rock concert or when making a phone-call in a very noisy environment, for example with background wind noise, this may adversely affect the sound quality. In such situations the controller may switch to using the loudspeaker as microphone instead. The microspeakers used in mobile phones may have a sensitivity that is typically 20-30 dB lower than for MEMS microphone and so may give improved audio experience in certain conditions.

Examples of the amplifier system herein described may be incorporated into mobile devices such as mobile phones, smart watches, laptops, tablet computers, portable medical devices, and portable audio players.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfill the functions of several means recited in the claims and reference signs in the claims shall not be construed as limiting the scope of the claims.

The invention claimed is:

1. An amplifier system for a loudspeaker, the amplifier system comprising:
at least one terminal for connecting an amplifier to a loudspeaker;
a first amplifier having an output coupled to the at least one terminal and an input for receiving an audio input signal;
an analog to digital converter;
a sensor having an input coupled to the at least one terminal and an output switch ably coupled to the analog to digital converter and configured for sensing at least one of a current and a voltage;
a second amplifier having an input coupled to the at least one terminal and an output switchably coupled to the analog to digital converter;
a controller coupled to the first amplifier, the second amplifier, the sensor and the analog to digital converter, and wherein the controller is operable in a first mode of operation to
enable the first amplifier, to couple the output of the sensor to the analog to digital converter and to disable the second amplifier;
and in a second mode of operation to disable the first amplifier, disable the sensor, enable the second amplifier and to couple the output of the second amplifier to the analog to digital converter.

2. The amplifier system of claim 1 wherein the second amplifier input is switchably coupled to the at least one terminal and wherein the controller is operable to disable the second amplifier by decoupling the input of the second amplifier from the at least one terminal in the first mode of operation.

3. The amplifier system of claim 1 wherein the second amplifier comprises a single amplifier stage.

4. The amplifier system of claim 1 wherein the second amplifier comprises MOS transistors configured in a common gate mode of operation.

5. The amplifier system of claim 4 wherein the input of the second amplifier comprises a pair of differential inputs and wherein each of the pair of differential inputs is switchably coupled to the source of a respect pair of MOS transistors.

6. The amplifier system of claim 4 further comprising a pair of current sources, each of the pair of current sources being arranged between a source of a respective one of the pair of MOS transistors and a ground potential.

7. The amplifier system of claim 4 wherein the second amplifier further comprises a bias circuit coupled to the gates of each of the pair of MOS transistors, wherein the bias circuit is configured to bias the MOS transistors in the weak inversion region.

8. The amplifier system of claim 3 further comprising a first chopper stabilization circuit arranged between the at least one terminal and the input of the second amplifier and a second chopper stabilization circuit arranged in series between the output of the second amplifier and the analog to digital converter, wherein the controller is coupled to the first and second chopper stabilization circuits and wherein in the second mode of operation the controller is configured to apply a predetermined chopper frequency to the first and second chopper stabilization circuits.

9. The amplifier system of claim 1 wherein the sensor comprises a sample and hold circuit.

10. The amplifier system of claim 1 wherein in the second mode of operation, the controller is configured to equalise an audio signal received from a loudspeaker connected to the at least one terminal based on a predetermined frequency response of the loudspeaker.

11. The amplifier system of claim 10 wherein in the first mode of operation, the controller is operable to sense a current flowing in a coil in a loudspeaker connected to the at least one terminal and to generate the predetermined frequency response from the detected current.

12. The amplifier system of claim 1 wherein the first amplifier comprises a class D audio amplifier.

13. A speaker amplifier comprising the amplifier system of claim 1.

14. An integrated circuit comprising the amplifier system of claim 1.

15. A mobile device comprising the amplifier of claim 1.

* * * * *